Nov. 27, 1956 J. C. LOGUE ET AL 2,772,410

TRANSISTOR INDICATOR CIRCUIT

Filed Sept. 30, 1954 3 Sheets-Sheet 1

*INVENTORS*
JOSEPH C. LOGUE
ROBERT A. HENLE

*BY* P. E. Henninger
ATTORNEY

INVENTORS
JOSEPH C. LOGUE
ROBERT A. HENLE
BY P. E. Henninger
ATTORNEY

Filed Sept. 30, 1954 3 Sheets-Sheet 3

INVENTORS
JOSEPH C. LOGUE
ROBERT A. HENLE
BY
P. E. Henninger
ATTORNEY

United States Patent Office 2,772,410

Patented Nov. 27, 1956

2,772,410

TRANSISTOR INDICATOR CIRCUIT

Joseph C. Logue, Kingston, and Robert A. Henle, Hyde Park, N. Y., assignors to International Business Machines Corporation, New York, N. Y., a corporation of New York Application September 30, 1954, Serial No. 459,289

12 Claims. (Cl. 340—252)

This invention relates to transistor circuits for controlling or driving visual signals or indicators to indicate electrical conditions in the transistor circuits.

One of the advantages of using transistor circuits, as opposed to vacuum tube circuits, is the fact that the transistor circuits operate at lower power levels. Furthermore, in the case of junction transistors, the circuits operate at low potential levels. The low powers and low potentials involved are not sufficient to operate the present commercially available electrical signal devices, such as lamps. Among the commercially available signal lamps those with the lowest power and voltage characteristics are neon glow lamps. Even these can not be successfully operated at the power and voltage levels available in conventional junction transistor circuits. Furthermore, the use in a conventional junction transistor circuit, of a potential high enough to operate a neon glow lamp, might subject the transistor to a potential high enough to damage it.

An object of the present invention is to provide an indicator circuit for operating a visual signal device in accordance with an electrical condition in a transistor.

Another object is to provide a circuit for operating a neon glow lamp under the control of a junction transistor, without subjecting the transistor to unduly high potentials.

A further object is to provide a transistor indicator circuit of the type described which will also serve as a clamp for the output of a trigger.

The foregoing objects of the invention are attained by connecting to the conventional output electrode of a transistor a conventional load branch and including a load resistor and a load supply battery in series, and a second branch including a glow discharge lamp and a second battery connected in series. The arrangement is such that the circuit through the glow discharge lamp includes in series the load resistor of the transistor, the load supply battery and the second battery. The two batteries are in series aiding in the lamp circuit and their total potential is greater than the ignition potential of the lamp. The potential drop cross the load resistor when the transistor is conducting is sufficient to reduce the potential available at the lamp terminals below the discharge maintaining potential of the lamp. Consequently the lamp is lit when the transistor is "off" and is extinguished when the transistor is "on."

In one modification of the invention, the indicator driving transistor is coupled to the output of a transistor trigger circuit through a current limiting resistor.

In another modification of the invention, the indicator driving transistor is coupled directly to the output electrode of a transistor trigger circuit, and the third electrode of the transistor is supplied with a clamping potential which effectively limits the potential at the output electrode of the trigger transistor when the trigger is "off."

Other objects and advantages of the invention will become apparent from a consideration of the following specification and claims, taken together with the accompanying drawings.

Figure 3:
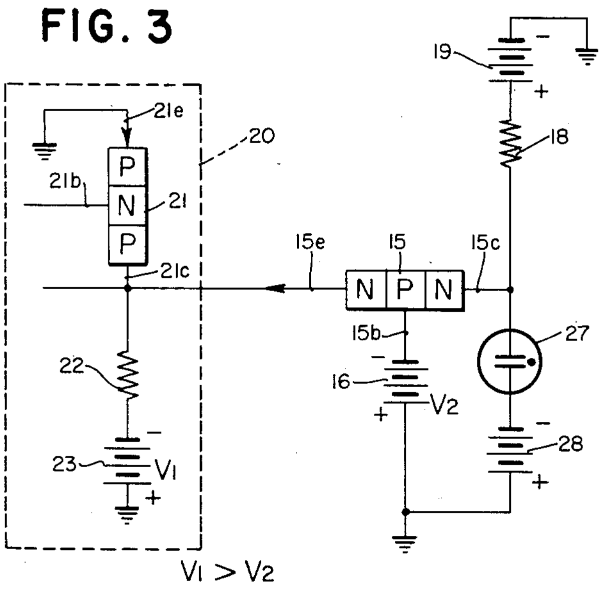
Fig. 3 is a wiring diagram of a somewhat different embodiment of the invention.
Figure 3A:
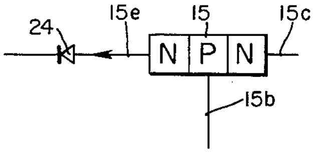

Fig. 3*a* is a fragmentary wiring diagram showing other modifications of the circuit of Fig. 3.

Figs. 4, 4*a*, 5, 6 and 7 are wiring diagrams showing other modifications of the invention.

Figure 1:
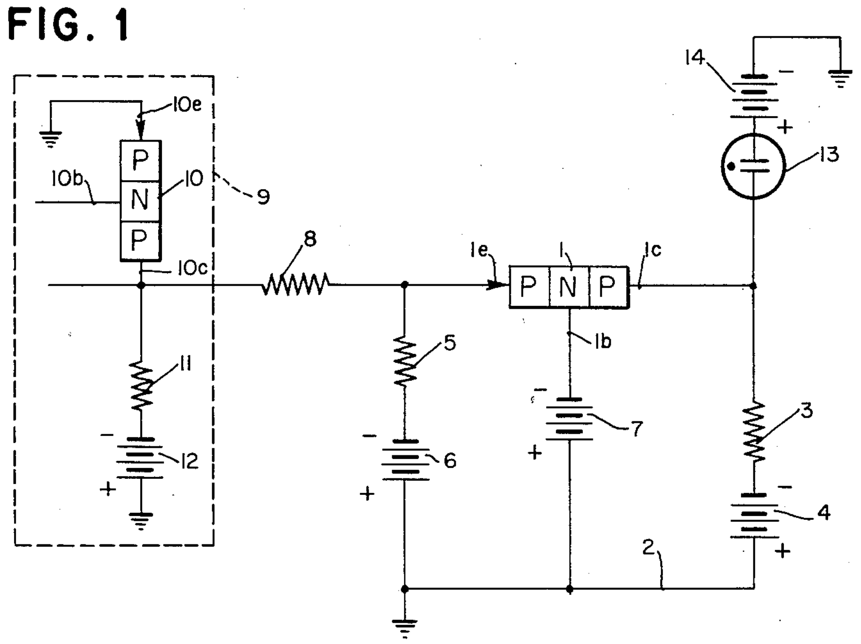
Figure 1 is a wiring diagram of an indicator circuit embodying the invention.

*Figure 1*

There is shown in Fig. 1 an indicator driving transistor circuit including a PNP junction transistor 1 having an emitter electrode 1*e*, a base electrode 1*b* and a collector electrode 1*c*. Connected between the collector electrode 1*c* and a ground wire 2 is a conventional load circuit including a load resistor 3 and a load supply battery 4. Connected between the emitter 1*e* and the ground wire 2 is a biasing circuit including a resistor 5 and a battery 6. Connected between base electrode 1*b* and ground wire 2, is a battery 7.

Emitter 1*e* is connected through a coupling resistor 8 to the output circuit of a transistor trigger circuit generally indicated by the reference numeral 9. The particular type of transistor trigger circuit is not important with respect to the present invention. For example, it may be one of the trigger circuits disclosed in the copending application of Robert A. Henle et al., Ser. No. 459,381 filed September 30, 1954.

As indicated in Fig. 1, the trigger circuit 9 includes a PNP junction transistor 10 having an emitter electrode 10*e*, a base electrode 10*b* and a collector electrode 10*c*. The emitter electrode 10*e* is grounded. The collector 10*c* is connected through a conventional load resistor 11 and a battery 12 to ground.

A neon glow discharge lamp 13 is connected in series with a battery 14 between the collector electrode 1*c* and ground.

*Operation of Figure 1*

When the transistor 10 in the trigger circuit 9 is "off," the emitter 1*e* is substantially at the potential of collector 10*c*, which is then at substantially the potential of the negative terminal of battery 12, so that emitter 1*e* is negative with respect to base 1*b*. Transistor 1 is then off, and substantially no current is flowing through the collector electrode 1*c*.

The lamp 13 is connected in a series circuit including resistor 3 and the batteries 4 and 14. The potentials of these batteries are arranged to aid one another in this series circuit. The sum of the potentials of batteries 4 and 14 is greater than the breakdown or ignition potential of the lamp 13, so that the lamp is lit.

Assuming now that the trigger circuit 9 switches to its "on" condition, so that a substantial current flows through resistor 11 and battery 12. This changes the potential of collector electrode 10*c* in a positive sense, and this change is transmitted through the resistor 8 to emitter electrode 1*e* of transistor 1, swinging emitter 1*e* positive and turning transistor 1 "on" and sending a substantial current through collector electrode 1*c*, load resistor 3 and battery 4. This current produces a potential drop across resistor 3 which reduces the potential available across the terminals of the lamp 13. The value of resistor 3 is selected so that this potential drop is sufficient to reduce the potential at lamp 13 below the discharge maintaining potential of that lamp, and the lamp is extinguished.

It may, therefore, be seen that lamp 13 indicates the condition of the trigger circuit 9. When the lamp 13 is lit, the transistor 10 is "off" and when the lamp 13 is extinguished, the transistor 10 is "on."

The resistor 8 in the circuit of Fig. 1 must be selected with some care. It must have sufficiently high resistance so that it will not unduly load the transistor 10, and it must have a sufficiently low resistance so that it will transmit sufficient current through emitter electrode 1e to produce a substantial current output from collector emitter 1c.

The circuit illustrated in Fig. 1 is not critical with respect to the characteristics of the lamp 13. It is only necessary that the lamp 13 have a discharge maintaining potential higher than that which exists when the transistor 1 is "on." The lamp 13 may have any breakdown potential, the required potential being supplied by properly selecting the potential of battery 14. When transistor 1 goes "off," the potential at its control electrode 1c goes toward the potential of the negative terminal of battery 4 until the potential across the lamp 13 reaches its breakdown potential.

Figure 2:
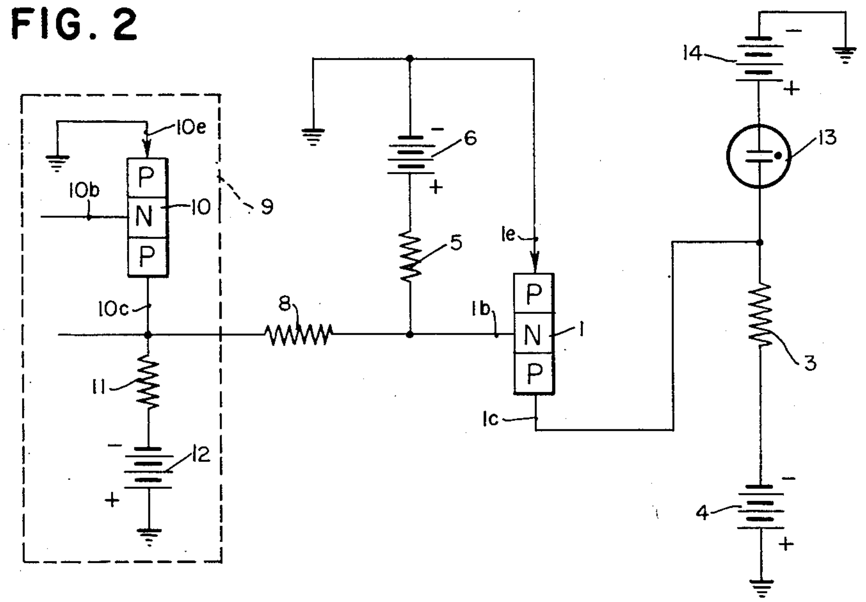
Fig. 2 is a wiring diagram of a modification of the circuit of Fig. 1.

*Figure 2*

In this figure, the transistor 1 is rearranged so as to use a base input rather than an emitter input. The circuit elements in Fig. 2 are the equivalents of their counterparts in Fig. 1 and have been given the same reference numerals.

When the transistor 10 is "off," its collector 10c is at its most negative potential, and this potential is communicated to base 1b, where it is effective to turn the transistor 1 "on." Current then flows from collector 1c through resistor 3, lowering the potential at the terminals of lamp 13 and extinguishing the light.

When transistor 10 turns "on," its collector 10c swings positive, and this positive potential is communicated to base 1b, where it is effective to turn the transistor 1 "off." This reduces the potential drop across resistor 3 and the potential at the terminal of lamp 13 becomes sufficient to start a discharge, lighting the lamp.

*Figure 3*

The circuit of Fig. 3 is intended for use with transistor trigger circuits of the type which have a clamping circuit connected to their output electrode or which may be operated with a clamping circuit connected to their output electrode. Such a trigger circuit is shown and described in the copending application of Robert A. Henle et al., Serial No. 459,381, filed September 30, 1954. In the present circuit, the indicator driving transistor performs the function of a clamp in addition to operating the signal lamp.

The circuit of Fig. 3 includes an NPN transistor 15 having an emitter electrode 15e, a base electrode 15b and a collector electrode 15c. The base electrode is connected through a battery 16 to ground wire 17. Collector electrode 15c is connected through a load resistor 18 and a battery 19 to ground, and is also connected through a neon glow discharge lamp 27 and a battery 28 to ground. Emitter 15e is connected directly to an output terminal of a trigger circuit 20, which may be one of the type disclosed in the Henle et al. application mentioned above. The trigger circuit 20 includes a PNP junction transistor 21 having an emitter electrode 21e, a base electrode 21b, and a collector electrode 21c connected through a load resistor 22 and a battery 23 to ground. It is essential that the potential of battery 23 be greater than the potential of battery 16.

*Operation of Figure 3*

When the transistor 21 of trigger 20 is "off," the collector electrode 21c tends to go to the potential of the negative terminal of battery 23, but is clamped at the potential of the negative terminal of battery 16, since the impedance of the transistor 15 between base 15b and emitter 15e is then very low. The transistor 15 is then on, since its emitter is negative with respect to its base, and a substantial current is flowing from collector 15c through load resistor 18 and battery 19. The potential drop across resistor 18 is sufficient to lower the potential at the terminals of lamp 27 below the discharge maintaining potential of that lamp, and the lamp is extinguished.

When the transistor 21 turns on, the potential of electrode 21c changes in a positive sense. This change is transmitted to emitter electrode 15e, thereby turning the transistor 15 "off," and reducing the current flow through resistor 18 to a point where the potential applied to the terminals of lamp 27 is greater than its breakdown potential, thereby illuminating the lamp.

When the transistor 21 is turned "on," it may be that there is stored in the base P-section of transistor 15 a sufficient number of minority current carriers, i. e., "electrons" so that the impedance between emitter electrode 15e and base electrode 15b is momentarily lowered until sufficient current passes through the transistor to recombine most of these "electrons" with holes. It may therefore happen that the transistor 15 will apply a momentary heavy load to the transistor 21 which is undesirable. This momentary heavy load may be prevented by connecting a diode 24 in series with the emitter electrode 15e as illustrated in Fig. 3a. The diode 24 will have substantially no effect on the operation of the circuit when the transistor 15 is "on" and will prevent undue loading of transistor 21 because of minority carrier storage in the transistor 15.

Figure 4:
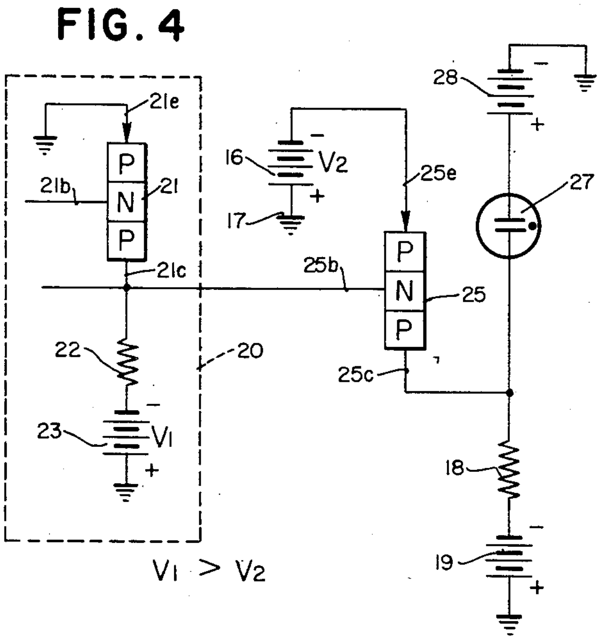

*Figure 4*

This figure is a modification of the circuit of Fig. 3 in which a PNP transistor 25 is used instead of the NPN transistor 15 of Fig. 3. Transistor 25 is connected with a base input rather than the emitter input of Fig. 3.

When transistor 21 is "off," its collector 12c is at its most negative value. The collector 21c tends to go to the potential of the negative terminal of battery 23, which is more negative than the negative terminal of battery 16. When the potential of collector 21c becomes more negative than the negative terminal of battery 16, then current flows from emitter 25e through base 25b, effectively clamping collector 21c at the potential of the negative terminal of battery 16. Transistor 25 is then substantially conductive. The current flowing from collector 25c produces a potential drop across resistor 18 sufficient to lower the potential at the terminals of lamp 27 and turn out the light.

When transistor 21 turns "on," its collector 21c swings positive. This positive potential is communicated to base 25b, where it is effective to turn the transistor 25 "off." The potential drop across resistor 18 is then reduced sufficiently so that lamp 27 is turned "on."

Figure 4A:
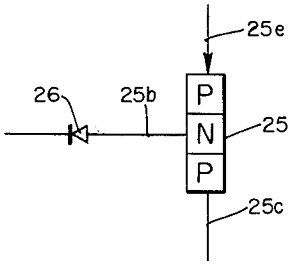

Fig. 4a shows the connection of a diode 26 in series with the base of transistor 25 in order to prevent undue loading of the trigger circuit 20 by minority carrier storage in the transistor 25. This arrangement and its operation is analogous to the diode 24 of Fig. 3a in its operation, and no further description is considered necessary.

Figure 5:
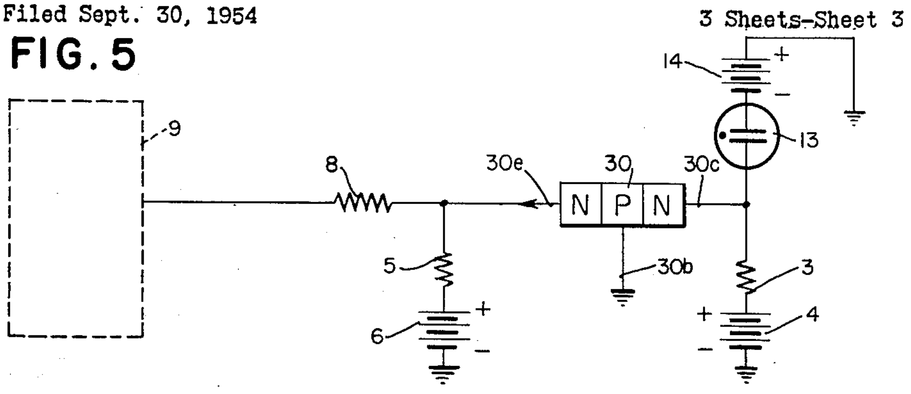
Figure 6:
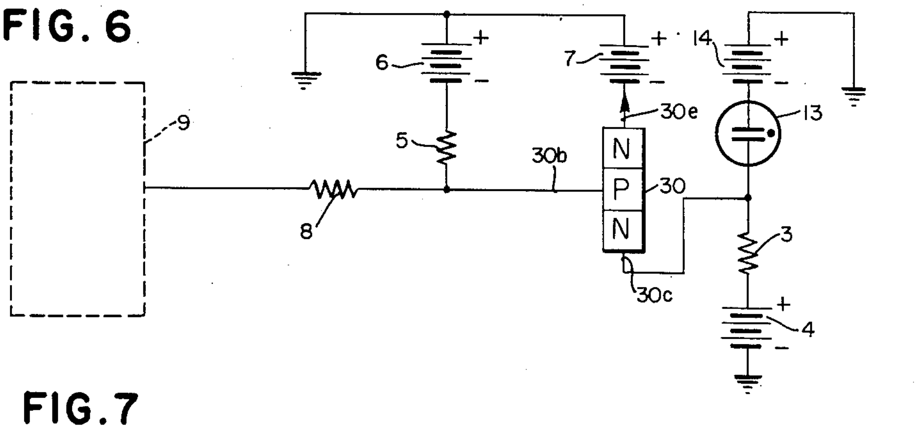

*Figures 5 and 6*

These figures show modifications of the circuits of Figs. 1 and 2, which are adapted to use an NPN junction transistor 30 in place of the PNP junction transistor 1 of Figs. 1 and 2.

The differences between the circuits of Figs. 5 and 6 and those of Figs. 1 and 2 are those which would readily occur to one skilled in the transistor art in shifting from one type transistor to the other. Specifically, the polarities of the batteries 4, 6 and 14 are reversed in Figs. 5 and 6 from the polarities indicated in Figs. 1 and 2. Furthermore, the biasing battery 7 of Fig. 1 has been omitted from the circuit of Fig. 5. Also, the same biasing battery has been included in the circuit of Fig. 6, but was not used in the circuit of Fig. 2.

The operation of the circuit of Figs. 5 and 6 is analogous to that of the circuits of Figs. 1 and 2, and further description is believed to be unnecessary.

Figure 7:
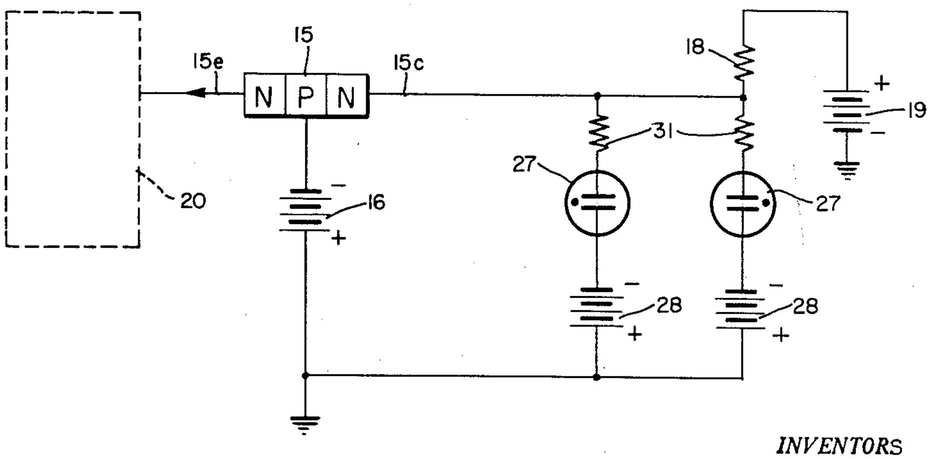

*Figure 7*

This figure illustrates a modification of the circuit of Fig. 3, in which two neon glow lamps 27 are controlled by the same transistor circuit. When using two lamps in this manner, it is necessary to add two resistors 31, one in series with each of the two glow lamps 27. These resistors are added to ensure that when one lamp comes on, the potential of the collector 15 remains sufficiently positive so that the potential across the second neon lamp remains greater than its ignition potential, thereby ensuring that both lamps will light, even though one lights somewhat more quickly than the other.

Following similar principles, it is possible to use any number of neon lamps. It is only necessary that a resistor be added in series with each of them, and that the resistors be so chosen that when all but one of the lamps are lighted, the dark lamp has across it a potential greater than its ignition potential.

Additional lamps may be inserted in the circuits of Figs. 1, 2 and 4 to 6, in a manner similar to that in which the lamp 27 was inserted in the circuit of Fig. 3 to produce the circuit of Fig. 7.

The following table shows by way of example particular values for the potentials of the various batteries and for the impedances of the various resistors and capacitors, in circuits which have been operated successfully. In some cases, the values are also shown in the drawing. These values are set forth by way of example only, and the invention is not limited to them nor to any of them. The diodes are considered to have substantially no impedance in their forward direction and substantially infinite impedance in the reverse direction.

TABLE I

| | |
|---|---|
| Resistor **3** | 125K |
| Battery **4** | 45v. |
| Resistor **5** | 390K |
| Battery **6** | 45v. |
| Battery **7** | 5v. |
| Resistor **8** | 8.1K |
| Resistor **11** | 1K |
| Battery **12** | 5v. |
| Lamp **13** | (1) |
| Battery **14** | 45v. |
| Battery **16** | 5v. |
| Resistor **18** | 39K |
| Battery **19** | 45v. |
| Resistor **22** | 3K |
| Battery **23** | 15v. |
| Lamp **27** | (2) |
| Battery **28** | 45v. |

[1] Neon Indicator ignition voltage of 75 volts extinction voltage of 55 volts.
[2] Neon Indicator same as Lamp 13.

While we have shown and described certain preferred embodiments of our invention other modifications will readily occur to those skilled in the art, and we therefore intend our invention to be limited only by the appended claims.

What is claimed is:

1. Visual signal apparatus comprising a glow discharge lamp, an energizing circuit for said lamp including a resistor and a source of unidirectional electrical energy in series, said source having a potential greater than the ignition potential of the lamp, and means for controlling the potential across the lamp including circuit means for conducting a current through said resistor to produce a potential drop thereacross of a polarity and magnitude effective to reduce the potential available at the lamp below the potential required to maintain a discharge through the lamp, said circuit means comprising atransistor having a base electrode, an emitter electrode and a collector electrode, means connecting the collector electrode in series with said resistor and at least a portion of said source of energy, and means for impressing across the other electrodes of the transistor a signal potential effective to control the current flow through said collector electrode.

2. Visual signal apparatus, comprising a transistor having an output electrode, load circuit means connected to said output electrode including a load resistor and a first source of unidirectional electrical energy in series, means for indicating an electrical condition in said load circuit means comprising a glow discharge lamp, and an energizing circuit for said lamp including in series said load resistor, said lamp and a second source of unidirectional electrical energy having a polarity opposite to that of the potential drop across said resistor produced by the current flowing through said output electrode.

3. Visual signal apparatus as defined in claim 2, in which said first source of energy supplies the load circuit of said transistor and said glow discharge lamp and said second source of energy supplies only the lamp.

4. Visual signal apparatus as defined in claim 2, in which said indicating means includes a plurality of glow discharge lamps, a plurality of said second resistors, and a corresponding plurality of energizing circuits for said lamps, each said energizing circuit including in series a second resistor, one of said lamps, and one of said second sources of unidirectional energy.

5. Apparatus for visually indicating an electrical condition, comprising: a transistor trigger circuit shiftable between two stable output states and including a first transistor having an output electrode, a load resistor and a first source of unidirectional electrical energy connected in series to said output electrode; means for amplifying an electrical condition in said trigger circuit comprising a second transistor having a base electrode, an emitter electrode, and a collector electrode, two of the electrodes of said second transistor serving respectively as input and output electrodes, a coupling resistor connecting the output electrode of said first transistor and the input electrode of the second transistor, means biasing said input electrode in a sense to hold said second transistor in a first predetermined conductive state, said trigger circuit and said coupling resistor being effective when the trigger shifts from one output state to the other to shift the second transistor to a second predetermined conductive state different from said first state, a load resistor and a second source of unidirectional electrical energy connected in series to said second transistor output electrode; a glow lamp and a third source of electrical energy connected in series to said second transistor output electrode, said second and third sources having terminals of opposite polarity connected, said second and third sources in series having a potential greater than the ignition potential of said glow lamp, said second transistor being effective when in one only of said first and second conductive states to produce across said load resistor a potential drop sufficient to reduce the potential at the glow lamp terminals below its discharge maintaining potential.

6. Apparatus for indicating an electrical condition as defined in claim 5, in which the emitter electrode of the second transistor serves as an input electrode.

7. Apparatus for indicating an electrical condition as defined in claim 5, in which the base electrode of said second transistor serves as the input electrode.

8. Apparatus for visually indicating an electrical condition, comprising: a transistor trigger circuit including a first transistor having an output electrode, a resistor and a first source of unidirectional electrical energy connected in series to said output electrode; means for amplifying an electrical condition in said trigger circuit comprising a second transistor having a base electrode, an emitter electrode, and a collector electrode, two of the electrodes of said second transistor serving respectively as input and output electrodes, means directly connecting the output electrode of said first transistor and the input electrode of the second transistor, means biasing the third electrode of the second transistor in a sense to hold said second transistor ON when said first transistor is OFF, said biasing means comprising a second source of electrical energy having a potential smaller than said first source and means connecting to said third electrode a terminal of said second source whose polarity corresponds to that of the terminal of said first source connected to said input electrode, said second source being effective when said first transistor is OFF to clamp the output potential thereof, a load resistor and a second source of unidirectional electrical energy connected in series to said output electrode, a glow lamp and a third source of electrical energy connected in series to said output electrode, said second and third sources having terminals of opposite polarity connected, said second and third sources in series having a potential greater than the ignition potential of said glow lamp, said second transistor being effective when conducting to produce across said load resistor a potential drop sufficient to reduce the potential at the glow lamp terminals below its discharge maintaining potential.

9. Apparatus for indicating an electrical condition as defined in claim 8, in which said second transistor is an NPN transistor and the emitter electrode thereof serves as the input electrode.

10. Apparatus for indicating an electrical condition as defined in claim 8, in which said second transistor is a PNP transistor and the base electrode thereof serves as an input electrode.

11. Apparatus for indicating an electrical condition as defined in claim 8, in which said directly connecting means includes a diode poled to prevent undue loading of the first transistor by minority carrier storage in the second transistor.

12. A transistor circuit including a first transistor having an output electrode, a resistor and a first source of unidirectional electrical energy connected in series to said output electrode, means for clamping said output electrode to limit the potential thereof when said first transistor is OFF, said clamping means comprising a second transistor having an input electrode connected to the output electrode of said first transistor and a second electrode connected to a source of clamping potential.

References Cited in the file of this patent

UNITED STATES PATENTS

| | | |
|---|---|---|
| 2,547,386 | Gray | Apr. 3, 1951 |
| 2,665,845 | Trent | Jan. 12, 1954 |
| 2,696,739 | Endres | Dec. 14, 1954 |